(12) United States Patent
Lin

(10) Patent No.: US 7,974,055 B2
(45) Date of Patent: Jul. 5, 2011

(54) METHOD FOR PROTECTING CIRCUITS FROM DAMAGE DUE TO CURRENTS AND VOLTAGES DURING MANUFACTURE

(76) Inventor: Wallace W. Lin, San Jose, CA (US)

(*) Notice: Subject to any disclaimer, the term of this patent is extended or adjusted under 35 U.S.C. 154(b) by 0 days.

(21) Appl. No.: 12/290,483

(22) Filed: Oct. 31, 2008

(65) Prior Publication Data

US 2009/0079003 A1 Mar. 26, 2009

Related U.S. Application Data

(63) Continuation-in-part of application No. 11/478,190, filed on Jun. 29, 2006.

(51) Int. Cl.
*H02H 9/00* (2006.01)
*H02H 3/22* (2006.01)

(52) U.S. Cl. .......................... 361/56; 361/111
(58) Field of Classification Search .............. 361/56, 361/111
See application file for complete search history.

(56) References Cited

U.S. PATENT DOCUMENTS

| | | | | |
|---|---|---|---|---|
| 4,409,607 A * | 10/1983 | Rumennik | ..... | 257/327 |
| 5,497,119 A * | 3/1996 | Tedrow et al. | ..... | 327/540 |
| 5,580,807 A * | 12/1996 | Sery et al. | ..... | 438/128 |
| 5,897,355 A * | 4/1999 | Bulucea et al. | ..... | 438/273 |
| 5,963,412 A * | 10/1999 | En | ..... | 361/111 |
| 6,297,984 B1 * | 10/2001 | Roizin | ..... | 365/106 |
| 6,566,930 B1 * | 5/2003 | Sato | ..... | 327/333 |
| 7,027,276 B2 * | 4/2006 | Chen | ..... | 361/56 |
| 7,116,606 B2 * | 10/2006 | Chou et al. | ..... | 365/244 |
| 2004/0007730 A1 * | 1/2004 | Chou et al. | ..... | 257/314 |
| 2008/0002317 A1 * | 1/2008 | Lin et al. | ..... | 361/56 |

OTHER PUBLICATIONS

Adel S. Sedra and Kenneth C. Smith, Microelectronic Circuits, Oxford University Press, Inc., pp. 378-379, 4th ed., 1982 (No month).*
S. Wolf, Silicon Processing for the VLSI Era, vol. 3—The Submicron MOSFET, pp. 136-139, Lattice Press, 1995 (No month).*
IEEE 100 The Authoritative Dictionary of IEEE Standard Terms, p. 284, 384, 7th ed., Standards Information Network, IEEE Press, 2000 (No month).*

* cited by examiner

*Primary Examiner* — Jared Fureman
*Assistant Examiner* — Lucy Thomas

(57) ABSTRACT

A protection circuit network includes one or more protection devices, used to protect one or more devices in an integrated circuit (IC) design. The protection devices are globally coupled together, for connection to an internal or external power supply. During manufacture of the IC, the protection circuit network protects the at-risk devices. During operation of the IC, the protection circuit network is powered down, such that excessive current leakage is avoided.

3 Claims, 10 Drawing Sheets

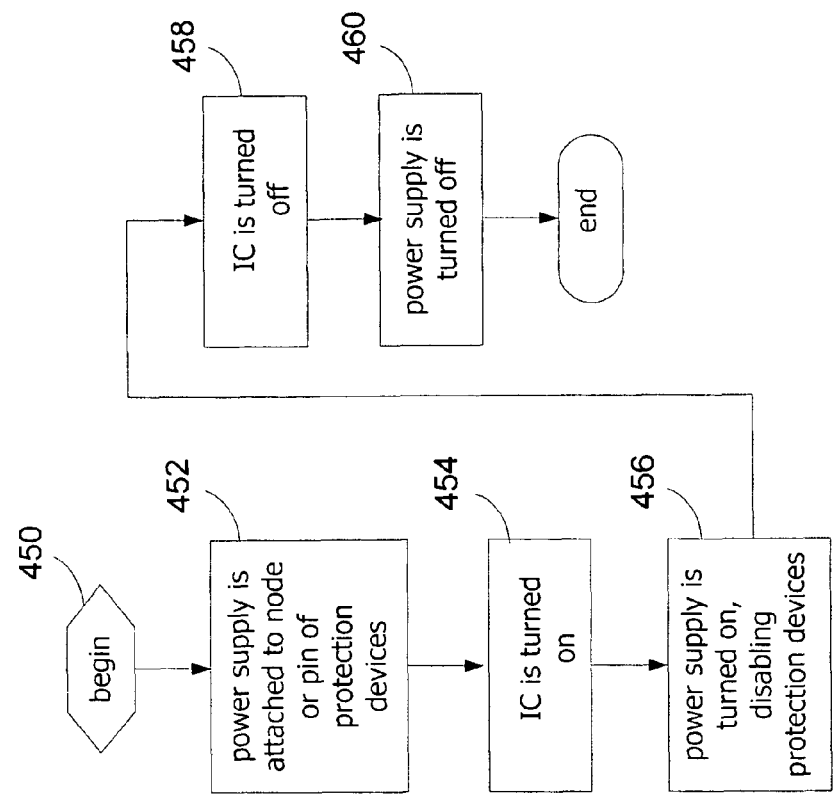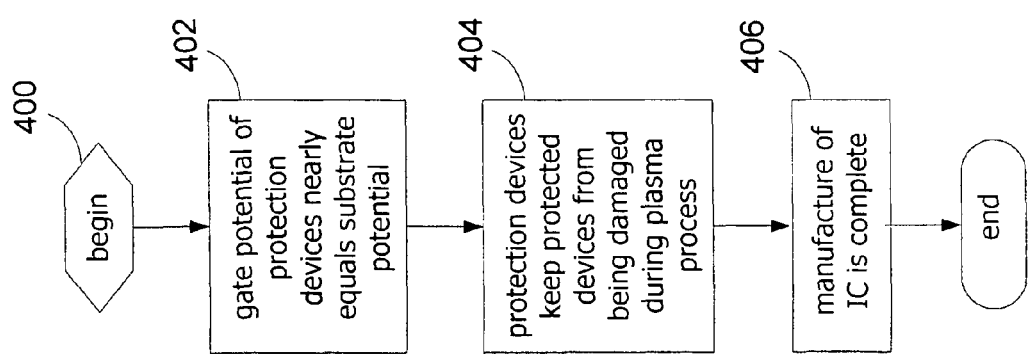

METHOD FOR PROTECTING CIRCUITS FROM DAMAGE DUE TO CURRENTS AND VOLTAGES DURING MANUFACTURE

CROSS-REFERENCE TO RELATED APPLICATION

This disclosure is a CIP application for a utility patent application, application Ser. No. 11/478,190 and Pub. No. US 2008/0002317 A1, filed on Jun. 29, 2006.

TECHNICAL FIELD

This disclosure relates to charging protection circuits.

BACKGROUND

The process for manufacturing integrated circuits (ICs) is a complex one, involving many distinct steps. In addition to curing, wire bonding, and many other back-end process steps, one or more plasma processes may occur, such as when the interlayer dielectric (ILD) layers or the metal patterns are formed. During the plasma process, the insulators (gates) of the many transistors making up the ICs may unintentionally experience currents (charges) and voltages (potential) from the plasma. These unwanted currents or voltages may damage or destroy the IC being manufactured. As a result, protection devices may be coupled to the at-risk devices (protected devices), such that, during the plasma processes, the device gates do not build up too much current or voltage. A single IC may have tens of thousands of protection devices.

The protection devices are made up of transistors, like the devices they are designed to protect (the protected devices). The transistors in the protection devices possess characteristics found in other transistors, namely, they may leak current during circuit operation. For some applications, such leakage may be undesirable.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein like reference numerals refer to like parts throughout the various views, unless otherwise specified.

FIG. 4 is a flow diagram showing operation of the integrated circuit including the protection circuit network of FIGS. 1 and 2, according to some embodiments;

DETAILED DESCRIPTION

In accordance with the embodiments described herein, a protection circuit network and method are disclosed. The protection circuit network includes one or more protection devices, used to protect one or more devices in an integrated circuit (IC) design. The protection devices are globally coupled together, for connection to an internal or external power supply. During manufacture of the IC, the protection circuit network protects the at-risk devices. During operation of the IC, the protection circuit network is powered down, such that excessive current leakage is avoided.

The devices to be protected may be categorized as one of several voltage classes, each voltage class operating in a voltage range, from low voltages to high voltages. Devices in the highest voltage class, with a novel design characteristic, are used as protection devices for each voltage class of device to be protected. The highest voltage class protection devices are characterized by a low threshold voltage, which, depending on the polarity, results in a high sub-threshold leakage or a very high on-state channel current, sufficient for protecting transistors of all voltage classes.

In the following detailed description, reference is made to the accompanying drawings, which show by way of illustration specific embodiments in which the described subject matter may be practiced. However, it is to be understood that other embodiments will become apparent to those of ordinary skill in the art upon reading this disclosure. The following detailed description is, therefore, not to be construed in a limiting sense, as the scope of the present disclosure is defined by the claims.

Figure 1:
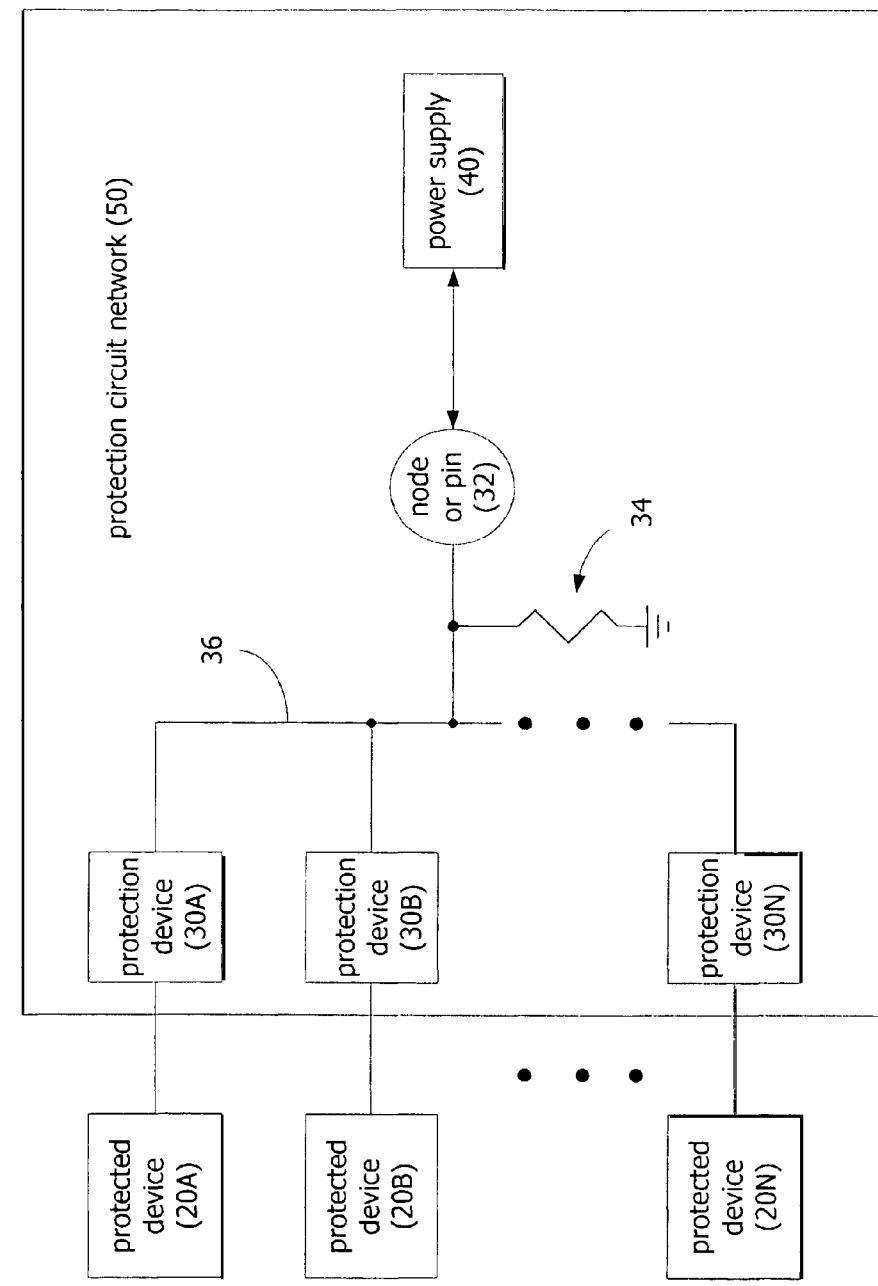
FIG. 1 is a block diagram of an integrated circuit including a protection circuit network, according to some embodiments.

FIG. 1 is a block diagram of an integrated circuit (IC) 100, including a protection circuit network 50, according to some embodiments. The protection circuit 50 includes protection devices 30A, 30B, . . . , 30N (collectively, protection devices 30), a node or pin 32, a resistor 34, a global connection 36, and a power supply 40. (Ellipses are shown in FIG. 1 to infer that the N device may be any number of devices.) The protection circuit network 50 may include a single protection device, such as protection device 30A, or multiple devices, as shown. Further, within each protection device (e.g., protection device 30A), there may be multiple protective circuit elements. The number of protection devices 30 disposed within the protection circuit network 50 is a design consideration, based upon the characteristics of the IC 100.

The node or pin 32 enables the power supply 40 to be coupled to the protection devices 30. The power supply may be an internal power supply within the IC 100, such as a pump circuit. Or, the power supply may be external to the IC 100. The global connection 36 connects each of the protection devices 30 to the power supply 40 and also to the resistor 34.

Outside the protection circuit network 50, the IC 100 includes protected devices 20A, 20B, . . . , 20N (collectively, protected devices 20). There may be a single device to be protected, such as protected device 20A, or multiple devices, as shown. Further, within each protected device 20 (e.g., protected device 20A), there may be multiple circuit elements to be protected. The number of protected devices 20 disposed within the IC is based upon the characteristics of the design.

Although a one-to-one connection between protected device 20 and protection device 30 is depicted in FIG. 1, there may be a one-to-many coupling, a many-to-one coupling, or a many-to-many coupling, between the devices 20 and 30. For example, the protected device 20A may include multiple circuit elements to be protected. Or, the protection device 30A may include multiple circuit elements to provide protection. Circuit designers of ordinary skill in the art will recognize a number of different configurations that nevertheless are described generally in FIG. 1.

The resistor 34 is coupled to each of the protection devices 20. The resistor 34, which is grounded to the substrate of the IC 100, enables the protection devices 30 to protect the protected devices 20, as intended, during manufacture of the IC 100. A particular implementation of the resistor 34 is provided in conjunction with the description of FIG. 2.

Figure 2:
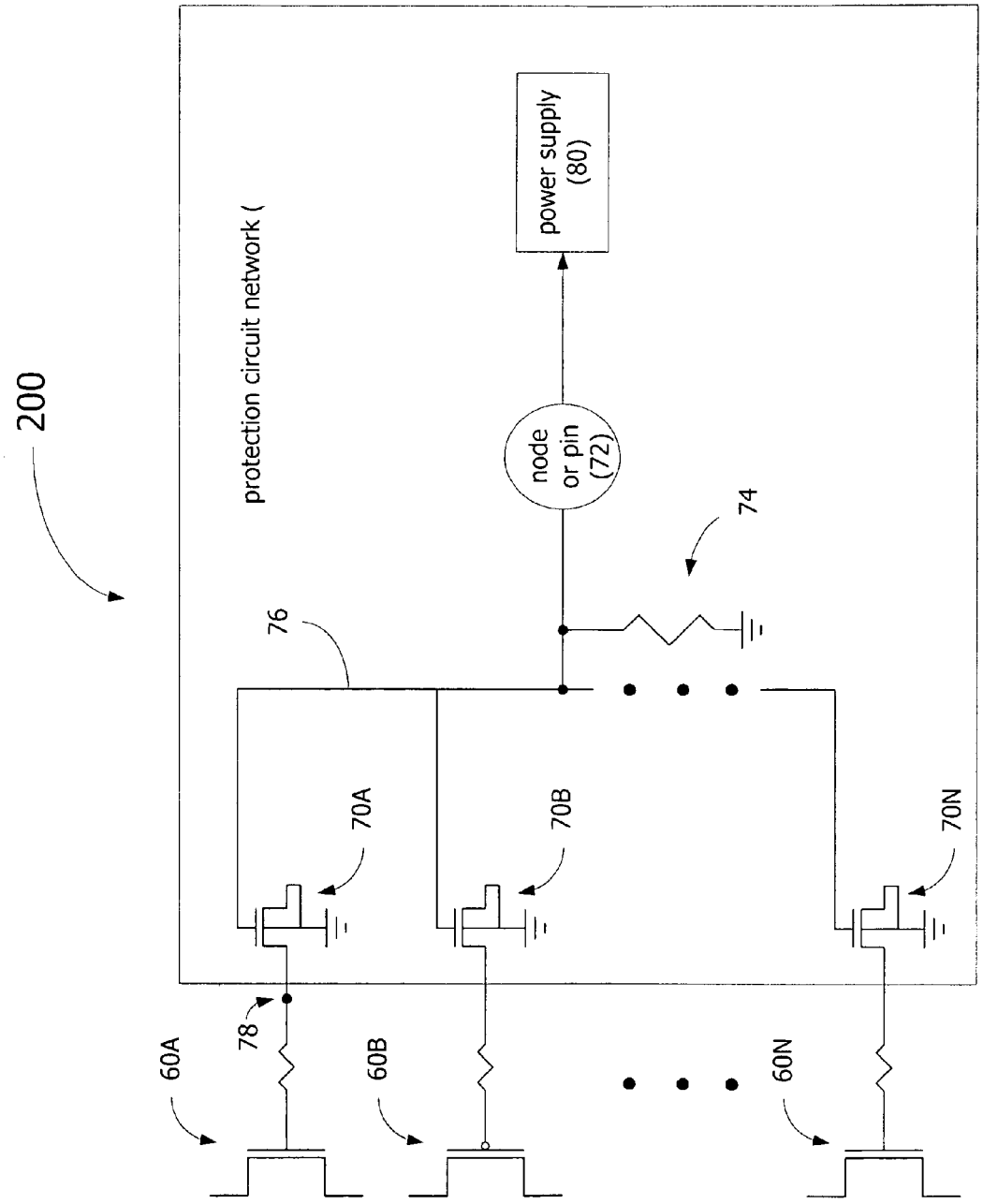
FIG. 2 is a circuit diagram of the integrated circuit including the protection circuit network of FIG. 1, according to some embodiments.

In FIG. 2, a circuit diagram of an IC 200, in which the protection devices and protected devices are complementary metal-oxide semiconductor (CMOS) transistors, according to some embodiments. The IC 200 includes protected transistors 60A, ..., 60N (collectively, protected transistors 60) coupled to a protection circuit network 90. The protected transistors 60A and 60N are N-type CMOS transistors; the protected transistor 60B is a P-type CMOS transistor.

The protection circuit network 90 includes protection transistors 70A, ..., 70N (collectively, protection transistors 70), a global connection 76 connecting all the protection transistors 70 together, a node or pin 72, a power supply 80, and a poly resistor 74. The protection transistors 70 are made up of N-type CMOS transistors.

The gate of the protected transistor 60A is connected to the drain of the corresponding protection transistor 70A. A single connection is depicted between the transistor 60A and the transistor 70A. However, there may be multiple additional connections at node 78 between the two transistors 60A and 70A. The additional connections are not shown in FIG. 2 for clarity.

In the protection circuit network 90, a single transistor 70A (protection device) is connected to a single transistor 60A (protected device), a one-to-one connection between transistors. However, there may be a one-to-many coupling, a many-to-one coupling, or a many-to-many coupling, between the protection device 70A and the protected device 60A. For example, there may be additional transistors (protected transistors) coupled to the node 78, which, together with the transistor 60A, are to be protected by the protection transistor 70A. Or, there may be additional transistors (protection transistors) coupled to the node 78 working in conjunction with the transistor 70A to protect the transistor 60A and additional circuit components, if any. Circuit designers of ordinary skill in the art will recognize a number of different configurations that nevertheless are described generally in FIG. 2. The simplified depiction of FIG. 2 is not intended to limit the possible arrangements of protected transistors and protection transistors.

The global connection 76 connects the gates of each protection transistor 70 together. (Ellipses are shown in FIG. 2 to infer that the N transistors may be any number of transistors.) The global connection 76 provides an electrical pathway between the gates of the protection devices 70 and the power supply 80 (by way of the node or pin 72). In some embodiments, the power supply 80 is used to simultaneously disable the protection transistors 70 during operation of the IC 200.

The transistors 70 protect the transistors 60 during manufacture of the IC 200. High current (charge) or voltage (potential) induced during the backend plasma processing of the IC 200 may be experienced by the gates of the transistors 60. The stress of such encounter may damage or destroy the transistors 60. The protection transistors 70 are coupled to the gate of the protected transistors 60 so that, during the backend plasma processing, the current or voltage at the gate of the protected transistor 60 does not build up, but dissipates or is pulled down through the protection transistor 70.

Figure 3:
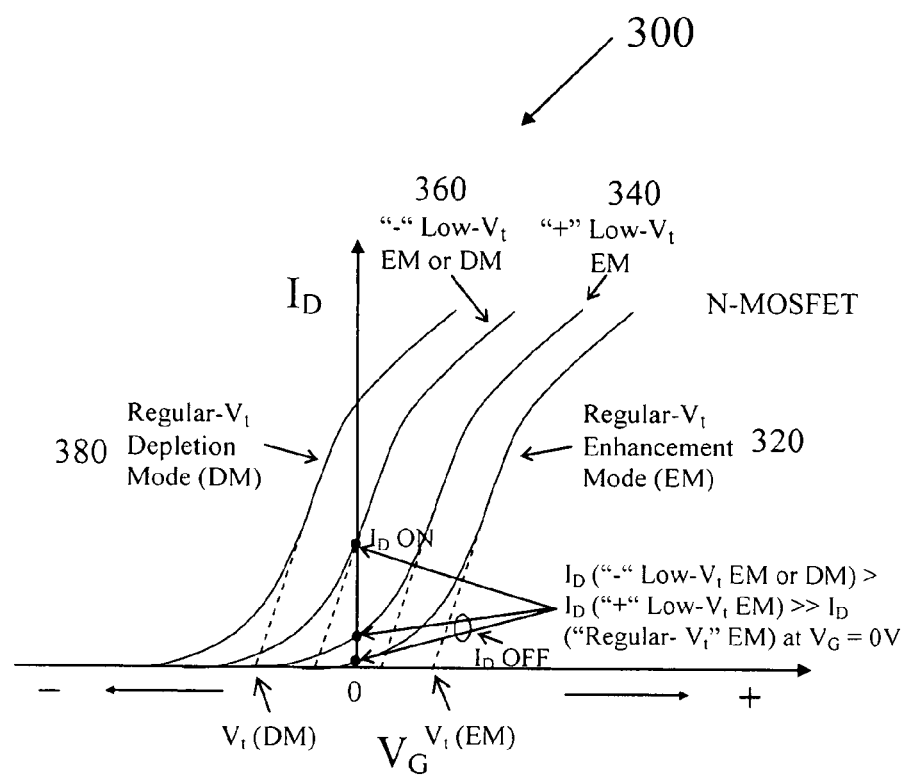
FIG. 3 is a graph showing current versus voltage characteristics of the Enhancement-Mode (EM) and Depletion-Mode (DM) N-channel transistor, according to some embodiments.

FIG. 3 describes drain current versus gate voltage ($I_d$-$V_g$) characteristics (300) of the Enhancement-Mode (EM) and Depletion-Mode (DM) N-channel metal-oxide-semiconductor field effect transistors (N-MOSFETs). The dotted straight lines that extend from the maximum-slope point of the current-voltage (I-V) curves intercept with the gate-voltage ($V_g$) axis. The $V_g$ values at the intercept points are the threshold voltages ($V_t$) of the respective I-V curves.

The right-most I-V curve belongs to a regular-$V_t$ EM N-MOSFET (320) which typically has a larger positive threshold voltage. The second-from-right I-V curve is from an EM N-MOSFET with a small positive threshold voltage (340). The second-from-left I-V curve belongs to either an EM or a DM N-MOSFET with a small negative threshold voltage (360). The left-most I-V curve belongs to a regular-$V_t$ DM N-MOSFET (380) which typically has a larger negative threshold voltage.

These I-V curves indicate several facts as follows. At zero gate voltage, the low-positive-$V_t$ EM N-MOSFET 340 has a higher off-state sub-threshold channel leakage than the regular-$V_t$ EM N-MOSFET 320. In comparison, the low-negative-$V_t$ EM or DM N-MOSFET 360 is turned on at zero gate voltage. Its on-state channel current can be much higher than the off-state sub-threshold channel leakage of the low-positive-$V_t$ EM N-MOSFET 340. These transistors, 340 and 360, provide higher current than the regular-$V_t$ EM N-MOSFET 320 at zero gate voltage, and at the same time, they are easily turned off with a small negative voltage applied to their gates because of their small threshold voltage. In contrast, the regular-$V_t$ DM N-MOSFET 380 is capable of providing extremely high on-state channel current at zero gate voltage, however, it requires a large negative gate voltage to turn off the current. The above facts suggest that both the low-positive-$V_t$ EM N-MOSFET 340 and the low-negative-$V_t$ EM or DM N-MOSFET 360 can be used as an effective charging protection device during plasma involved IC manufacturing process with 360 offering the best protection efficiency. Their leakages during IC operation can be minimized if a proper turn-off strategy is employed. These transistors, 340 and 360, are particularly useful in low voltage, low current and low power IC applications due to their low threshold voltages.

There may be tens of thousands of protection devices in a typical IC design such as the IC circuit 200. The gate of each protection transistor 70 in IC 200 is typically connected directly to the source to the substrate, such that the potential of the protection transistor gate stays near the substrate potential. The protection transistor 70 thus, depending on the type of protection device used, provides a leakage path through either the off-state sub-threshold leakage or the on-state channel current as delineated by the EM and DM transistor I-V behaviors 300 in FIG. 3. This leakage path to dissipates the charging current or to pull down the charging voltage build-up on the gate of the protected transistor 60 during plasma processing. Once the manufacturing process is complete, the protection transistors 70 should no longer be used. The protection transistors 70 are only used to protect other transistors 60 during manufacture.

Despite not being part of the circuit operation, the protection transistors 70 may leak current. For example, according to transistor theory, when the transistor gate is at a zero or near zero potential relative to the substrate, with the source connected to the substrate, the EM transistor with a positive threshold voltage operates in the sub-threshold conduction mode. Under this mode, the transistor continues to leak current between its source and its drain. Thus, these unused protection transistors 70 are likely to leak current. The IC may include thousands or more of such protection transistors and may thus be quite leaky during operation. The leakage may be undesirable for some circuit applications.

In some embodiments, the leakage problem is solved by turning off the protection transistors 70 during operation of the IC 200. The protection transistors 70 are disabled or turned off by turning on the power supply 80 coupled to the gates of each protection transistor 70. Although the protection transistors 70 may still leak when the gates of these transistors are at the potential of the substrate, the leakage would be is substantially less if the power supply 80 had been turned on. The IC 200 including the protection circuit network 90 thus operates without undesirable current leakage from the protection transistors 70. During the plasma related manufacturing process, the protection devices 70 operate as designed; that is, the devices 70 protect the transistors 60 throughout the IC 200. The protection circuit network 90 thus is an improvement over prior art designs, in that the protection of the transistors 60 afforded by the transistors 70 is maintained, yet leakage by the transistors 70 is substantially reduced during operation of the IC 200.

During the manufacture of the IC 200, distinct operations are performed, the details of which are not included herein. One or more of these operations may involve a plasma material, such as a plasma deposition or etch operation. An event in which the gate (insulator) of a transistor receives a build-up of current (charge) or voltage (potential) due to the presence of plasma material is known herein as a plasma charging event. For the protection devices 70 to defend the protected devices 60 from plasma charging events, the voltage at the gate of each protection device is preferably near the voltage at the substrate, which is the "ground" of the wafer. In this way, the protection device uses its off-state sub-threshold (low-positive-$V_t$ EM protection device) or on-state (low-negative-$V_t$ EM or DM protection device) conduction current to form the leakage path and protect the protected transistor during both positive and negative charge plasma cycles. Accordingly, the poly resistor 74 is coupled to each gate of each protection transistor 70, and grounded to the substrate.

In some embodiments, the poly resistor 74 is not a discrete circuit, but is made up of poly-silicon (also known as poly), a material used as part of transistor formation in the silicon wafer. In the protection circuit network 90, the poly resistor 74 (formed along with the transistors 60 and 70) is connected to the global connection 76, which connects the gates of each protection transistor 70 together. During the plasma process of the IC 200, the poly resistor 74, which is grounded to the substrate of the wafer upon which the IC 200 is formed, ensures that the gate of each protection transistor 70 is close to the potential of the substrate. Current building up on the gate of the protected transistor 60 flows through the protection transistor 70 to the substrate. By providing a path through which the current may safely flow, the protection transistors 70 are effective against plasma charging events that may otherwise damage the protected transistors 60 in the IC 200. The leakage of the protection transistors 70 ensures that the protected transistors 60 are not damaged or destroyed during the plasma charging events.

FIG. 4A is a flow diagram 400 showing operation of the protection circuit network 90 during manufacture (specifically, plasma processing) of the IC 200, according to some embodiments. The steps of FIG. 4A may also apply to the protection circuit network 50 (FIG. 1). For simplicity, only the circuit 90 is described. The steps shown in FIG. 4A may be combined or occur in an order different than is shown. (Another flow diagram 450, FIG. 4B, described below, shows operation of the protection circuit network 90 during operation of the IC 200.)

Thus, in the flow diagram 400, the plasma process begins. The gate potential of the protection devices 70 are nearly equal to the substrate potential (block 402). The effect is that the protection devices 70 keep the protected devices 60 from being damaged during IC manufacture, specifically, plasma charging events (block 404). At some point, the manufacture of the IC 200 is complete (block 406). The operation of the flow diagram 400 (plasma process of the IC manufacturing process) is thus complete.

FIG. 4B is a flow diagram 450, showing operation of the protection circuit network 90 in the IC 200 during circuit operation, according to some embodiments. The steps of FIG. 4A may also apply to the protection circuit network 50 (FIG. 1). For simplicity, only the circuit 90 is described.

To prevent leakage of the protection transistors 70, the power supply 80 is attached to the internal node or external pin 72 of the protection circuit network 90 (block 452). (Where an external power supply is used, the power supply connects to a pin; where an internal power supply is used, the power supply connects to a node.) Once the IC 200 is turned on (block 454), the power supply 80 is turned on (block 456), disabling the protection devices 70. In some embodiments, the power supply 80 is turned on automatically as the IC 200 is turned on. As another alternative, the power supply 80 may be turned on as part of the initialization of the IC 200.

Once the IC 200 is turned off (block 458), the power supply 80 is turned off as well (block 460). Where the protection circuit network power supply 80 is coupled to an IC power supply (not shown), the power supply 80 may automatically be turned off when the IC 200 is turned off. The operation of the flow diagram 450 (IC operation) is thus complete.

Figure 5:
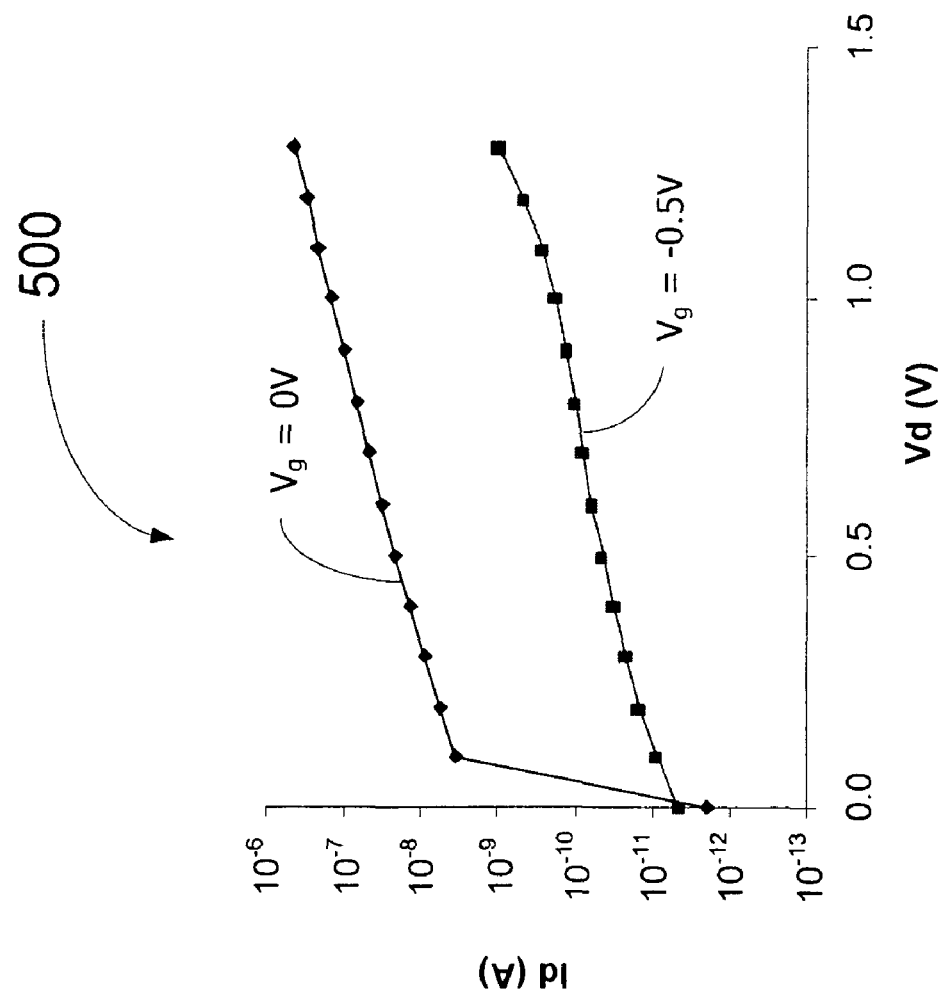
FIG. 5 is a graph showing current versus voltage of the protection transistor as compared to a prior art protection transistor, according to some embodiments.

FIG. 5 is a graph 500 showing current versus voltage at the drain node of a CMOS thin-gate 25 Angstrom (Å) gate-oxide protection transistor (EM with +0.4V threshold voltage), such as the protection transistor 70A of the protection circuit network 90 (FIG. 2). The transistor was measured twice, once where the gate voltage ($V_g$) is zero volts (diamonds), then again where the gate voltage ($V_g$) equals −0.5 V (squares). The measurement configuration is source voltage ($V_s$)=bulk voltage ($V_b$)=0 V, drain voltage ($V_d$)=0 to 1.3 V. The drain node of the protection transistor is connected to the device node to be protected. In the examples given above, the drain node of the protection transistor is connected to the gate node of the protected device.

In the prior art sample, where $V_g$=0, the gate of the protection device is connected to its source and to the substrate. Thus, as desired for protection, the gate potential is at the substrate potential. The leakage at $V_d$=1.3 V is approximately $5\times10^{-7}$ Amps, or 0.5 uAmps (micro amps), which is mostly the sub-threshold leakage of the device. Where hundreds, thousands, or more of such devices are used as protection devices, an undesirable amount of leakage may result (total leakage would be 5 mAmp (milli amps) if 10,000 of these devices are used together). On the other hand, where $V_g$=−0.5 V, the drain leakage is about $10^{-9}$ Amps, or approximately 500 times lower than when $V_g$=0 V.

Charging Protection for Devices of Different Voltage Classes

An integrated circuit may be made up of devices of different voltage classes. In CMOS technology, devices of different voltage classes are typically protected by charging protection devices of their same voltage class. For example, transistors of a low-voltage class (LVC) (e.g., 25 Å-Tox transistors with a 1.3V operating voltage) are protected by transistors of the same low-voltage class. Transistors of a medium-voltage class (MVC) (e.g., 45 Å-Tox transistors with a 2V operating voltage) are protected by transistors of the same medium-voltage class. And, transistors of a high-voltage class (HVC) (e.g., 90 or 150 Å-Tox transistors with a 3.3V operating voltage) are protected by transistors of the same high-voltage class.

The different classes of transistors are described in relative terms. There may be one, two, or many voltage classes for devices in the design of integrated circuits, using any of the available technologies. As used herein, three distinct voltage classes are defined. A device may be described as a low-voltage class (LVC) device if the device operates at a first predetermined voltage and includes a device with a gate insulator thickness less than or equal to a first predetermined thickness. A device is described as a medium-voltage class (MVC) device if the device operates at a voltage greater than the first predetermined voltage but less than or equal to a second predetermined voltage and includes a device with a gate insulator thickness greater than the first predetermined thickness, but less than or equal to a second predetermined thickness. A device is described as a high-voltage class (HVC) device if the device operates at a voltage higher than the second predetermined voltage and includes a device with a gate insulator thickness greater than the second predetermined thickness.

In CMOS technology, most of the transistors are Enhancement-Mode. In such circumstance, LVC transistors normally have a low threshold voltage and subsequently a high sub-threshold leakage. LVC transistors, besides protecting other LVC transistors, are capable of protecting higher voltage class of transistors, such as MVC and HVC transistors during plasma process. On the other hand, higher voltage class transistors normally are not suitable for protecting lower voltage class transistors, due to their higher threshold voltage and lower sub-threshold leakage. As a result, the HVC transistors are not leaky enough to protect MVC and LVC transistors, and the MVC transistors are not leaky enough to protect LVC transistors.

However, during circuit operation, the very thin gate oxide of the LVC transistors cannot sustain the higher operating voltage of the higher voltage class transistors, and, as such, LVC transistors are not good candidates for protecting MVC or HVC transistors. Similarly, the MVC transistors are not good candidates for protecting HVC transistors.

Because of these limitations, in CMOS technology, LVC transistors are most often used to protect other LVC transistors. MVC transistors are most often used to protect other MVC transistors. HVC transistors are most often used to protect other HVC transistors.

Because of the thick gate oxides, a HVC transistor may be used as a protection transistor 70 for any voltage class of protected transistor 60, whether HVC, MVC, or LVC transistors. HVC transistors are typically not used to protect MVC or LVC transistors because of their relatively higher threshold voltage, and thus, lower sub-threshold leakage. A novel design of the HVC transistor overcomes this barrier. Such design enables the protection transistors 70 of FIG. 2 to posses a low threshold voltage (and thus a high leakage) with the HVC transistor gate oxide thickness. If there are many different voltage classes in the integrated-circuit design, the transistor of the highest voltage class will be used as the protection device. Such a highest-voltage-class protection device will have the thickest available gate oxide in a given integrated-circuit manufacturing technology.

The protection devices 70A, 70B . . . and 70N each may be multiple protection transistors or multiple protection circuits to protect the corresponding protected devices, 60A, 60B . . . mad 60N, each of which may also be multiple protected transistors or multiple protected circuits. Each of the corresponding pairs of the protection mid protected circuits may reside in different locations of a chip, and each of these locations may be designed to receive different combinations of the gate oxide thickness. Therefore, the HVC protection transistors in the protection circuits at different locations of the chip may possess the thickest available gate oxide in their own locations. The use of the highest-voltage-class HVC transistor as a charging protection transistor must satisfy the following two criteria: (i) the protection transistor can provide high channel current at zero gate voltage; (ii) the protection transistor can be well turned off (i.e., has minimum leakage after being turned off) with a small gate voltage.

There may be many processes by which this highest-voltage-class HVC protection device is designed so that it has a very low threshold voltage. As used herein, a very low threshold voltage is defined as a threshold voltage that is substantially near zero volts. Devices described herein as being very-low-threshold-voltage devices are those with a threshold voltage substantially close to zero volts. Circuit designers of ordinary skill in the art recognize many methods for achieving a very low threshold voltage. In CMOS technology, for example, the very low threshold voltage of the HVC transistor is achieved by adjusting the channel and substrate dopant concentration, in some embodiments.

Figure 6:
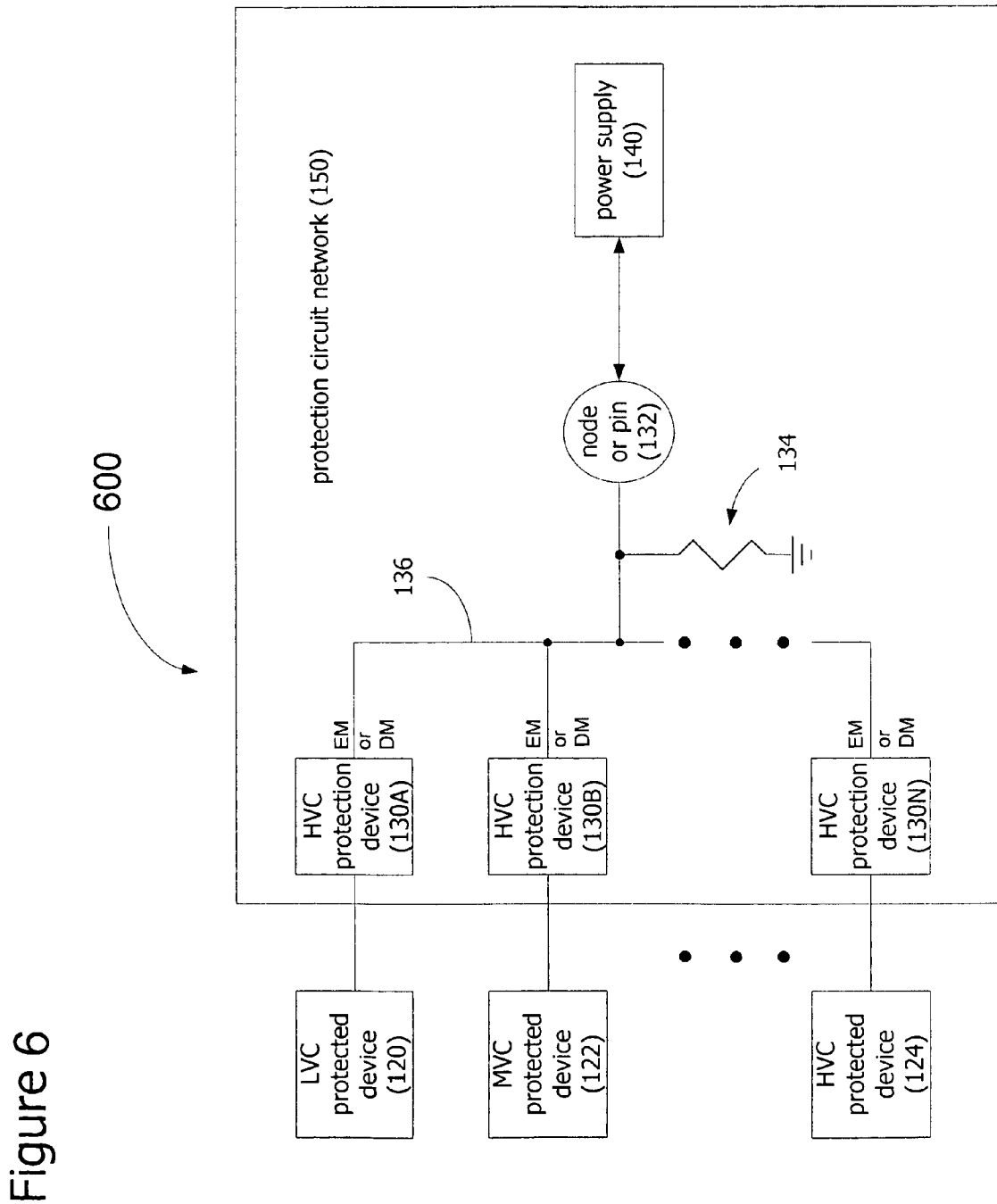
FIG. 6 is a block diagram of one implementation of the integrated circuit of FIG. 1, according to some embodiments.

In FIG. 6, an IC 600 is depicted, according to some embodiments. Although devices may belong to many different voltage classes, the IC 600, for simplicity, includes LVC protected devices 120, MVC protected devices 122, HVC protected devices 124, and a protection circuit network 150. The protection circuit network 150 includes HVC protection devices 130A, . . . 130N (collectively, HVC protection devices 130), which are connected via a global connection 136, a resistor 134, a node or pin 132, and a power supply 140. (Ellipses are shown to infer that the device may be any number of devices.) The HVC protection devices 130 are designed to be either EM or DM mode and possess a low threshold voltage, either positive or negative, and thus, a high sub-threshold leakage (positive-$V_t$ EM) or high on-state channel current (negative-$V_t$ EM or DM) during plasma events. The protection circuit network 150 may include a single protection device, such as protection device 130A, or multiple devices, as shown. Further, within each protection device (e.g., protection device 130A), there may be multiple protective circuit elements. The number of protection devices 130 disposed within the protection circuit network 150 is a design consideration, based upon the characteristics of the IC 600.

The node or pin 132 enables the power supply 140, which may be internal or external, to be coupled to the protection devices 130. The global connection 136 connects each of the protection devices 130 to the power supply 140 and also to the resistor 134.

Outside the protection circuit network 150, the IC 600 includes protected devices 120, 122, . . . 124. There may be a single device to be protected, such as the LVC protected device 120, or multiple devices, as shown. Further, within each protected device (e.g., protected device 120), there may be multiple circuit elements to be protected. The number of protected devices 120 is based upon the characteristics of the design. The IC 600 uses HVC protection devices 130 to protect all classes of devices (120, 122, 124).

Although a one-to-one connection between protected device 120 and protection device 130 is depicted in FIG. 6, there may be a one-to-many coupling, a many-to-one coupling, or a many-to-many coupling, between the devices 120 and 130. For example, the protected device 120 may include multiple circuit elements to be protected. Or, the protection device 130 may include multiple circuit elements to provide protection.

Figure 7:
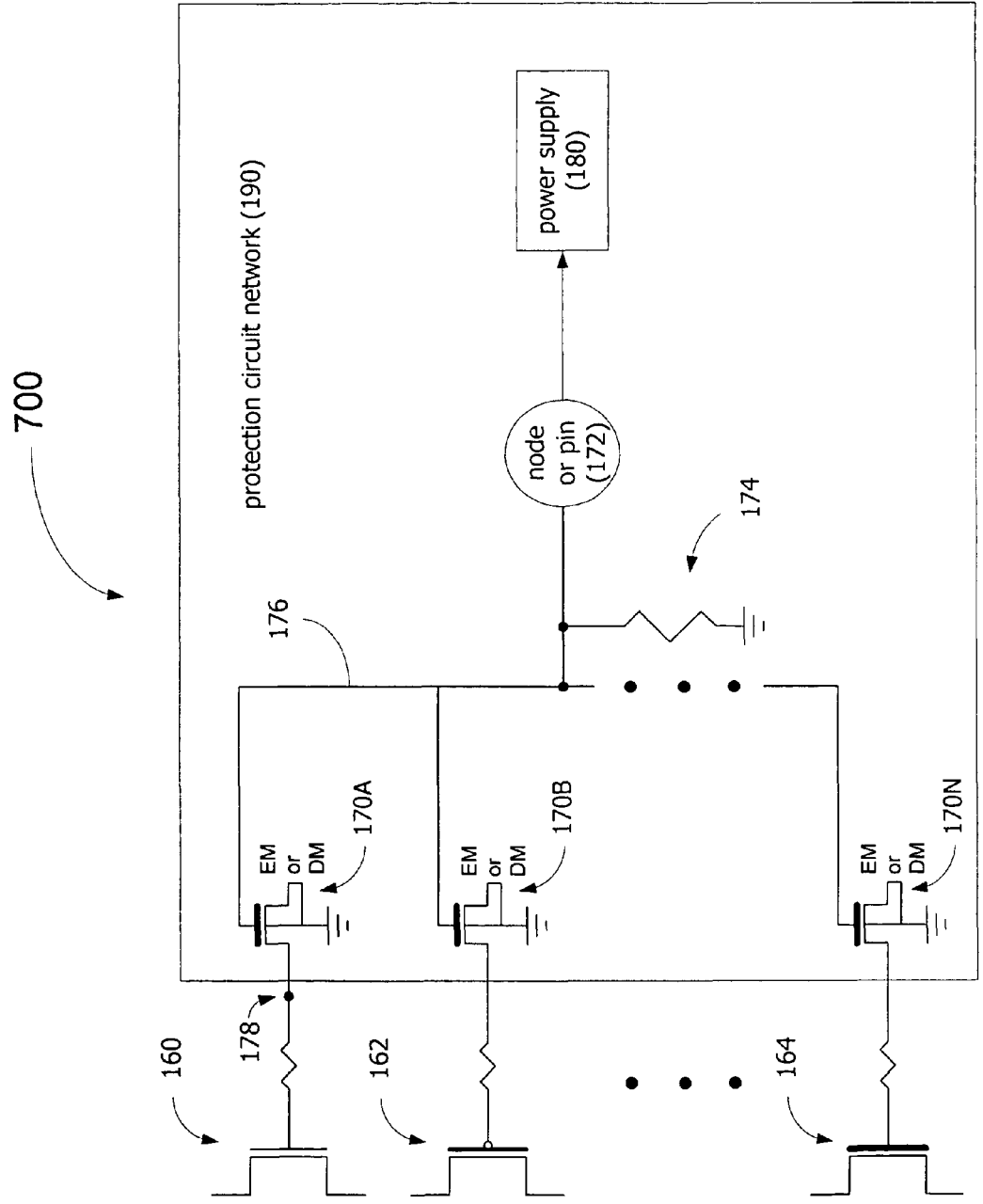
FIG. 7 is a circuit diagram of the integrated circuit of FIG. 6, according to some embodiments.

In FIG. 7, an IC 700 is depicted, in which the protection devices and protected devices are CMOS transistors, according to some embodiments. The IC 700 includes protected transistors 160, 162, and 164 coupled to a protection circuit network 190. The protected transistors 160 and 164 are N-type CMOS transistors; the protected transistor 162 is a P-type CMOS transistor.

The protection circuit network 190 includes protection transistors 170A, ..., 170N (collectively, protection transistors 170), a global connection 176 connecting all the protection transistors 170 together, a node or pin 172, a power supply 180, and a poly resistor 174. The protection transistors 170 are made up of N-type CMOS transistors.

The gate of the protected transistor 160 is connected to the drain of the corresponding protection transistor 170A. A single connection is depicted between the transistor 160 and the transistor 170A. However, there may be multiple additional connections at node 178 between the two transistors 160 and 170A.

The global connection 176 connects the gates of each protection transistor 170 together. (Ellipses are shown in FIG. 7 to infer that the N transistors may be any number of transistors.) The global connection 176 provides an electrical pathway between the gates of the protection devices 170 and the power supply 180 (by way of the node or pin 172). In some embodiments, the power supply 180 is used to simultaneously disable the protection transistors 70 during operation of the IC 700.

The transistors 170 protect the transistors 160, 162, and 164 during the back-end manufacturing process of the IC 700. The protection transistors 170 are coupled to the gate of the protected transistors 160, 162, 164 so that, during the backend plasma processing, current or voltage at the gate of the protected transistor 160, 162, 164 does not build up, but dissipates or is pulled down through the protection transistor 170.

The protection transistors 170 are shown with a thick gate in FIG. 6, to denote that they are HVC transistors. The gate of each protection transistor 170 is typically connected directly to the source and to the substrate, such that the potential of the protection transistor gate stays near the substrate potential. With a very low threshold voltage at each of the protection transistors 170, the very-low-threshold-voltage protection transistor 170A provides an efficient leakage path to dissipate the current or to pull down the voltage build-up on the gate of the LVC protected transistor 160 during plasma processing. The very-low-threshold-voltage HVC protection transistor 170B provides an efficient leakage path to dissipate the current or to pull down the voltage build-up on the gate of the MVC protected transistor 162. The HVC protection transistor 170N provides a leakage path to dissipate the current or to pull down the voltage build-up on the gate of the HVC protected transistor 164.

Once the manufacturing process is complete, the leaky very-low-threshold-voltage protection transistors 170 should no longer be used during circuit operation. The protection transistors 170 are only used to protect LVC, MVC, and HVC transistors during manufacture.

In some embodiments, the leakage problem is solved by turning off the leaky very-low-threshold-voltage protection transistors 170 during operation of the IC 700, by turning on the power supply 180 coupled to the gates of each protection transistor 170. During the manufacture of the IC 700, the poly resistor 174, which is grounded to the substrate, ensures that the gate of each protection transistor 170 is close to the potential of the substrate.

Figure 8:
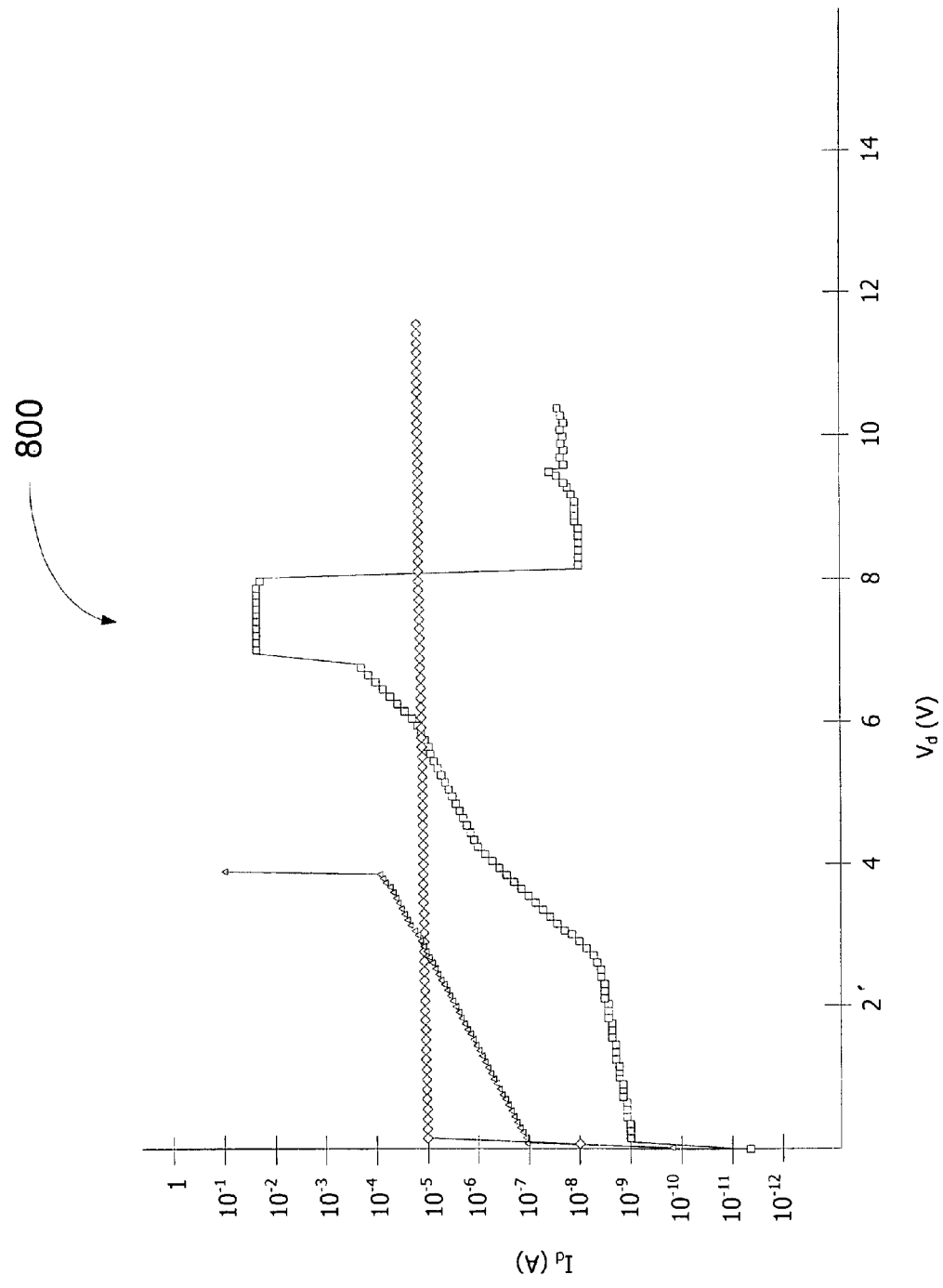
FIG. 8 is a graph comparing the charging protection capability of transistors of different voltage classes, according to some embodiments.

In FIG. 8, a graph 800 comparing the measured drain current versus drain voltage for the three voltage class CMOS transistors is depicted, according to some embodiments. The graph shows data for an N-type Enhancement-Mode HVC CMOS transistor with a very low negative threshold voltage at −0.08 V (diamonds), an Enhancement-Mode MVC transistor with a typical positive threshold voltage at 0.6V (squares), and an Enhancement-Mode LVC transistor, also with a typical positive threshold voltage at 0.4V (triangles). FIG. 8 shows the comparison of the measured drain current versus drain voltage at 125° C. and $V_g=V_s=V_b=0V$. The data of FIG. 8 simulates the protection efficiency of the three types of protection devices during plasma processing. The HVC transistor shows a high on-state channel conduction current (nearly 10 uA). The high current effectively pins the potential at the gate of the protected transistor down to less than 0.1 V, in some embodiments. The typical-threshold-voltage LVC and the MVC transistors provide much less leakage protection than the very-low-threshold-voltage HVC transistors, in some embodiments.

Figure 9:
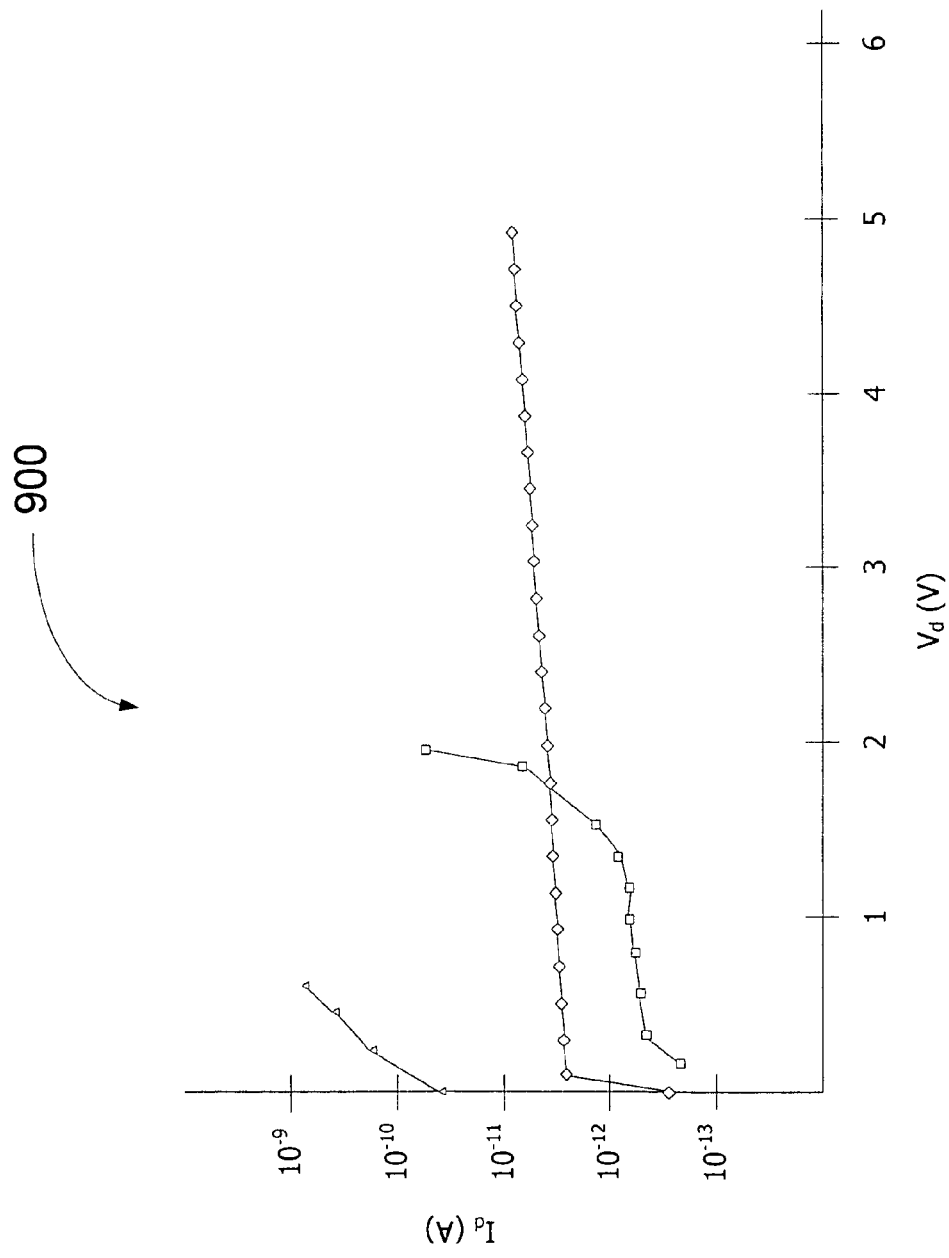
FIG. 9 is a graph comparing the drain leakage level of protection transistors of different voltage classes, according to some embodiments.

FIG. 9 is a graph 900 showing the drain leakage of the same HVC, MVC, and LVC protection transistors described in FIG. 8, according to some embodiments. The drain leakage is measured at room temperature when the transistors are turned off with a −0.5 V applied at their gates. The data suggests that, at nominal operating voltages [1.3 V for LVC transistors (triangles), 2 V for MVC transistors (squares), and 3.3 V for HVC transistors (diamonds)], at the gate of the three classes of protected transistors, the −80 mV threshold voltage NMOS HVC protection transistor (FIG. 8) will have the least amount of leakage during circuit operation. While the −80 mV NMOS HVC protection transistor is used to sufficiently protect LVC and MVC transistors during the plasma backend manufacturing process, its leakage at the operating voltages of the LVC and MVC transistors may be even lower than that of the LVC and MVC transistors shown in the graph 900.

As the graph 900 shows, the leakage level of the −80 mV $V_t$ NMOS HVC protection transistor is quite flat over a wide range of $V_d$. This is because its gate oxide is quite thick (typically, 150 Å Tox). Further, the drain-to-substrate junction leakage is far from turning on in this range of Vd, due to the low well doping concentration, which contributes to the low threshold voltage of this protection transistor. In some embodiments, the level of the flat off-state leakage of the NMOS HVC protection device may be controlled at will by adjusting the bias applied to the control gate pad. Further, by increasing the gate bias towards a more negative direction, a further reduction of the leakage level may be achieved.

There may be many applications for the protection circuit networks 50, 90, 150, and 190. Certainly, systems in which low voltage, low current and low power application are desired may benefit using the protection circuit network. The protection circuit network ensures a higher yield during manufacture of an IC, as transistors therein are protected against plasma charging events, which may otherwise damage the IC.

Figure 10:
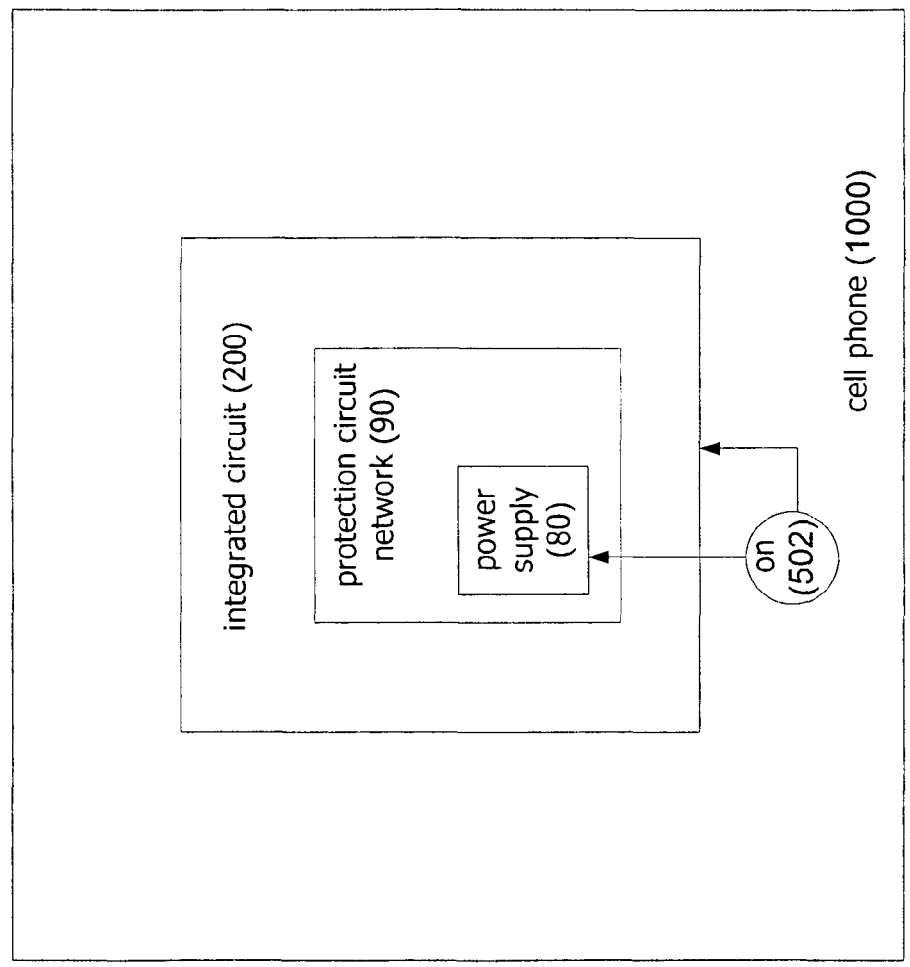
FIG. 10 is a block diagram of a system using the integrated circuit including the protection circuit network of FIG. 2, according to some embodiments.

An example of a system that includes the integrated circuit 200 including the protection circuit network 90 is depicted in FIG. 10, according to some embodiments. (Alternatively, the cell phone 1000 may include the more general IC 100, including the protection circuit network 50, the IC 600 including the protection circuit network 150, or the IC 700, including the protection circuit network 190.) A cell phone 1000 includes the integrated circuit 200. The integrated circuit 200 may include transistors and other hardware, as well as software, such as a read-only memory (ROM) (not shown), to facilitate operation of the cell phone. Before becoming part of the cell phone 1000, the integrated circuit 200 was manufactured using the protection circuit network 90 to protect devices disposed within the circuit 200, as described above. An on button 502 is connected to the protection circuit network 90. By touching the on button 502, the integrated circuit 200 is activated, which makes the cell phone 1000 operational. In some embodiments, the power supply 80 of the protection circuit network 90 is turned on when the on button 502 is activated. As described above, once the power supply 80 is turned on, the protection transistors 70 (not shown) within the protection circuit network 90 are disabled, such that leakage from the transistors 70 is minimal. Disabling the protection circuit network 90 during operation of the cell phone 1000 minimizes the leakage current of the integrated circuit 200. As a result, the cell phone 1000 may remain charged for a longer period of time. When the on button is deactivated (to turn the cell phone 1000 off), the power supply is likewise turned off.

The protection circuit networks 50, 90, 150, 190 and method of operating, as described in the flow diagrams 400 (IC manufacture) and 450 (IC operation), may be employed with many different types of transistors. More broadly, the protection circuit networks 50, 90, 150, 190 and methods 400, 450 may be used with any transistor that has an insulator at its gate. Furthermore, transistors produced using any type of materials may benefit from the protection circuit networks 50, 90, 150, and 190 and method 400, 450, described herein.

While the disclosure has been described with respect to a limited number of embodiments, those skilled in the art will appreciate numerous modifications and variations therefrom. It is intended that the appended claims cover all such modifications and variations as fall within the true spirit and scope of the disclosed subject matter.

I claim:
1. An integrated circuit comprising:
a protection circuit device receiving a current or a voltage during a plasma-related manufacturing process of the integrated circuit, and an integrated circuitry being protected by said protection circuit device, the protection circuit device comprising:
a single protection transistor, a single circuitry formed by a plurality of the single protection transistors, or a circuitry network formed by a plurality of said single circuitries, wherein the protection transistors are enhancement-mode N-channel MOSFETs, having a thick-gate oxide and a small negative threshold voltage of less than 100 milivolts;
a coupling of a poly resistor to a gate of the protection transistor, the poly resistor being coupled to a wafer substrate, to maintain the protection transistor gate, which is exposed to plasma, at nearly substrate potential during plasma process;
a protection node coupling the drain of the protection transistor to a gate of a protected transistor and a coupling of the source of the protection transistor to its substrate to dissipate negative plasma charges at the protection node through a forward-biased drain-to-substrate junction of the protection transistor, and to dissipate positive plasma charges at the protection node through the gate channel current from drain to source to substrate of the protection transistor during plasma process;
a coupling of the gate of the protection transistor to a power supply to turn off the protection transistor during circuit operation; and
a coupling of two or more gates of the protection transistors in a protection circuitry or a protection circuitry network.
2. The integrated circuit of claim 1, wherein the thick-gate protection transistors further include the protection transistors with a thickest gate oxide available at their locations of a chip according to the chip design.
3. The integrated circuit of claim 1, wherein the protected integrated circuitry comprising:
the protected transistor, a circuitry formed by a plurality of the protected transistors, or a circuitry network formed by a plurality of circuitries, wherein the protected transistors include MOSFETs of N and P channel and various gate oxide thickness and threshold voltages; and a coupling of two or more gates of the protected transistors in a protected circuitry or a protected circuitry network.

* * * * *